US012560659B2

(12) United States Patent
Wang et al.

(10) Patent No.: US 12,560,659 B2
(45) Date of Patent: Feb. 24, 2026

(54) LEAKAGE CURRENT DETECTION CIRCUIT AND LEAKAGE CURRENT PROTECTION CIRCUIT

(71) Applicant: Schneider Electric (China) Co., Ltd., Beijing (CN)

(72) Inventors: Han Wang, Shanghai (CN); Jie Feng, Shanghai (CN); Chunchao Hu, Shanghai (CN); Jiawei Liu, Shanghai (CN); Yihan Ding, Shanghai (CN)

(73) Assignee: Schneider Electric (China) Co., Ltd., Beijing (CN)

( * ) Notice: Subject to any disclaimer, the term of this patent is extended or adjusted under 35 U.S.C. 154(b) by 182 days.

(21) Appl. No.: 18/389,996

(22) Filed: Dec. 20, 2023

(65) Prior Publication Data

US 2025/0189598 A1 Jun. 12, 2025

(30) Foreign Application Priority Data

Dec. 12, 2023 (CN) .......................... 202323387214.2

(51) Int. Cl.
 *G01R 31/52* (2020.01)
 *H02H 7/22* (2006.01)
(52) U.S. Cl.
 CPC ............. *G01R 31/52* (2020.01); *H02H 7/226* (2013.01)
(58) Field of Classification Search
 CPC .. G01R 31/52; G01R 19/0092; G01R 15/185; H02H 7/226

(Continued)

(56) References Cited

U.S. PATENT DOCUMENTS

| | | | | | |
|---|---|---|---|---|---|
| 2017/0350927 | A1* | 12/2017 | Gabrielsson | ........... | H02H 3/338 |
| 2021/0265832 | A1* | 8/2021 | Li | ........................... | H02H 3/335 |
| 2023/0020049 | A1* | 1/2023 | Wang | ................... | G01R 15/183 |

FOREIGN PATENT DOCUMENTS

| | | | |
|---|---|---|---|
| CN | 115275934 A | | 11/2022 |
| EP | 4249931 A1 | | 9/2023 |
| JP | 2018072228 A | * | 5/2018 |

OTHER PUBLICATIONS

T. R. Oliveira, "Design of a Low-Cost Residual Current Sensor for LVDC Power Distribution Application," 2018 13th IEEE International Conference on Industry Applications (INDUSCON), Sao Paulo, Brazil, 2018, pp. 1313-1319, doi: 10.1109/INDUSCON.2018. 8627238 (Year: 2018).*

(Continued)

*Primary Examiner* — Sreeya Sreevatsa
(74) *Attorney, Agent, or Firm* — Patterson + Sheridan, LLP

(57) ABSTRACT

A leakage current detection circuit and a leakage current protection circuit are disclosed. The leakage current detection circuit includes a mutual inductance module, an excitation module, a signal processing module, a feedback self-check module and a calculation module. The mutual inductance module includes a magnetic core, a first winding and a second winding. The excitation module is configured for producing an excitation current in the first winding. The signal processing module is configured for processing the output voltage signal of the first winding and outputting a processed signal, and the voltage signal corresponding to the excitation current is filtered out of the processed signal. The feedback self-check module includes a feedback circuit and a self-check circuit. The calculation module is configured for analyzing the leakage current according to the processed signals and outputting the self-check signal in the self-check mode.

11 Claims, 4 Drawing Sheets

(58) Field of Classification Search
USPC ........................................................ 361/93.1
See application file for complete search history.

(56) References Cited

OTHER PUBLICATIONS

Shtabel, Nikolay et al., "Fluxgate Direct Current Sensor for Real-Time Insulation Resistance Monitoring", 2019 International Conference on Industrial Engineering, Applications and Manufacturing (ICIEAM), IEEE, Mar. 25, 2019, pp. 1-5.
European Search Report and Search Opinion dated May 24, 2024 for corresponding European Patent Application No. EP 23218831.8, 15 pages.

* cited by examiner

LEAKAGE CURRENT DETECTION CIRCUIT AND LEAKAGE CURRENT PROTECTION CIRCUIT

TECHNICAL FIELD

The present disclosure relates to the field of leakage current detection, specifically to a leakage current detection circuit and a leakage current protection circuit.

BACKGROUND

To ensure the safety of electricity, leakage current detection and leakage current protection in the process of power distribution are very important. According to the applicable detection current types, there are AC type, A type and B type leakage current detection. Different from AC type and A type leakage current detection, B type leakage current detection can not only detect the AC leakage current, but also detect the DC component in leakage current, thus it is widely used in three-phase variable-speed industrial drivers, single-phase/three-phase chargers for electric vehicles, three-phase photovoltaic system medical devices, DC current loads and so on, providing effective monitoring and protection for circuits and electrical devices.

The current mainstream B type leakage current detection is based on fluxgate technology, and the detected current passes through the magnetic core, and an excitation signal is injected into the winding wound around the magnetic core, the magnetic core is excited and the magnetic core is repeatedly saturated forward and backward, and in this process, the primary side current affects the secondary side induced electromotive force, and then the secondary side output voltage signal is resolved with the help of software or hardware. According to the different requirements of detection accuracy, stability, size and so on, leakage current detection can be carried out with the help of single magnetic core or double magnetic core, and an open-loop detection scheme or a closed-loop detection scheme can be adopted (that is, there is a feedback mechanism).

Safety standards require the leakage current detection circuit or the leakage current detection apparatus to have self-check function, that is, the leakage current is introduced into the leakage current detection circuit artificially and actively regularly to check whether the leakage current detection function of the leakage current detection circuit is normal. Currently, the self-check function of the leakage current detection apparatus is usually realized by drawing the leakage current from the mains power, which needs the help of separate self-check winding and self-check circuit, and because the mains power is AC power, this method of drawing the leakage current cannot actually check whether the detection function of the leakage current detection circuit for the DC component in the current is normal, and the amplitude and waveform of the self-check current are fixed, which makes the self-check function single.

SUMMARY

In order to solve the above problems, the present disclosure provides a leakage current detection circuit and a leakage current protection circuit, which adopt a single magnetic core and double-winding closed-loop detection scheme, and simultaneously combine the self-check winding with the feedback winding, so that a separate self-check winding is not needed, and in addition, different types of self-check signals can be produced according to the needs through algorithms.

The embodiment of the present disclosure provides a leakage current detection circuit capable of operating in a leakage current detection mode and a self-check mode, wherein the leakage current detection circuit comprises a mutual inductance module, an excitation module, a signal processing module, a feedback self-check module and a calculation module.

The mutual inductance module comprises a magnetic core, a first winding and a second winding, wherein the magnetic core is configured for being passed through by power lines, and the first winding and the second winding are surrounded on the magnetic core.

The excitation module is connected with the first winding and is configured for producing excitation current in the first winding.

The signal processing module is connected with the first winding and the calculation module, and is configured for processing the output voltage signal of the first winding and outputting a processed signal, and a voltage signal corresponding to the excitation current is filtered out of the processed signal.

The feedback self-check module is connected with the second winding and comprises a feedback circuit and a self-check circuit, wherein the feedback circuit is connected with the signal processing module and is configured for producing a feedback current in the second winding according to the processed signal, and the self-check circuit is connected with the calculation module and is configured for producing a self-check current in the second winding according to a self-check signal.

The calculation module is configured for analyzing the leakage current according to the processed signal and outputting the self-check signal in the self-check mode.

According to an embodiment of the present disclosure, the excitation module comprises a square wave excitation voltage generator for producing positive and negative square wave voltages of a predetermined frequency applied at the first winding.

According to an embodiment of the present disclosure, the predetermined frequency is a frequency greater than 5 times a frequency of a measured current.

According to an embodiment of the present disclosure, the signal processing module comprises a first resistor and a low-pass filter, wherein one end of the first resistor is connected with the first winding and the other end is grounded, for making an output current of the first winding flow back the ground; and the low-pass filter is configured for filtering a voltage signal corresponding to the excitation current from the output voltage signal.

According to an embodiment of the present disclosure, the feedback circuit produces a feedback current in the second winding according to the processed signal, so that the second winding produces a magnetic flux opposite to a magnetic flux produced by the measured current, and a zero-flux state is formed in the mutual inductance module.

According to an embodiment of the present disclosure, the feedback circuit comprises a second resistor, one end of the second resistor is connected with the signal processing module and the other end is connected with the second winding.

According to an embodiment of the present disclosure, the self-check circuit comprises a third resistor and a capacitor connected in series.

According to an embodiment of the present disclosure, the calculation module is a microcontroller.

According to an embodiment of the present disclosure, the leakage current detection circuit further comprises: a gain conversion module connected between the signal processing module and the calculation module and another gain conversion module connected between the self-check circuit and the calculation module, the gain conversion module is configured for scaling signals.

An embodiment of the present disclosure provides a leakage current protection circuit, wherein the leakage current protection circuit comprises: the leakage current detection circuit according to one of the embodiments of the present disclosure; and a switch connected with the leakage current detection circuit and the power lines, and the switch is configured for disconnecting the power lines in response to a leakage current detected by the leakage current detection circuit.

The leakage current detection circuit of the present disclosure adopts a double-winding closed-loop detection scheme, which realizes higher stability and accuracy compared with the leakage current detection circuit adopting a single-winding open-loop detection scheme. The leakage current detection circuit according to the present disclosure omits the extra self-check winding, and the self-check function can be realized only by utilizing the double-winding of closed-loop detection, and reducing the size and saving the cost. In addition, the leakage current detection circuit according to the present disclosure can customize different self-check leakage current waveforms through algorithms, and has better self-check ability.

BRIEF DESCRIPTION OF DRAWINGS

In order to illustrate the technical scheme of the embodiments of the present disclosure more clearly, the figures needed to be used in the description of the embodiments will be briefly introduced below. Obviously, the figures in the description below are only some exemplary embodiments of the present disclosure, and other figures may be obtained according to these figures without creative work for those skilled in the art.

DETAILED DESCRIPTION

Figure 1:
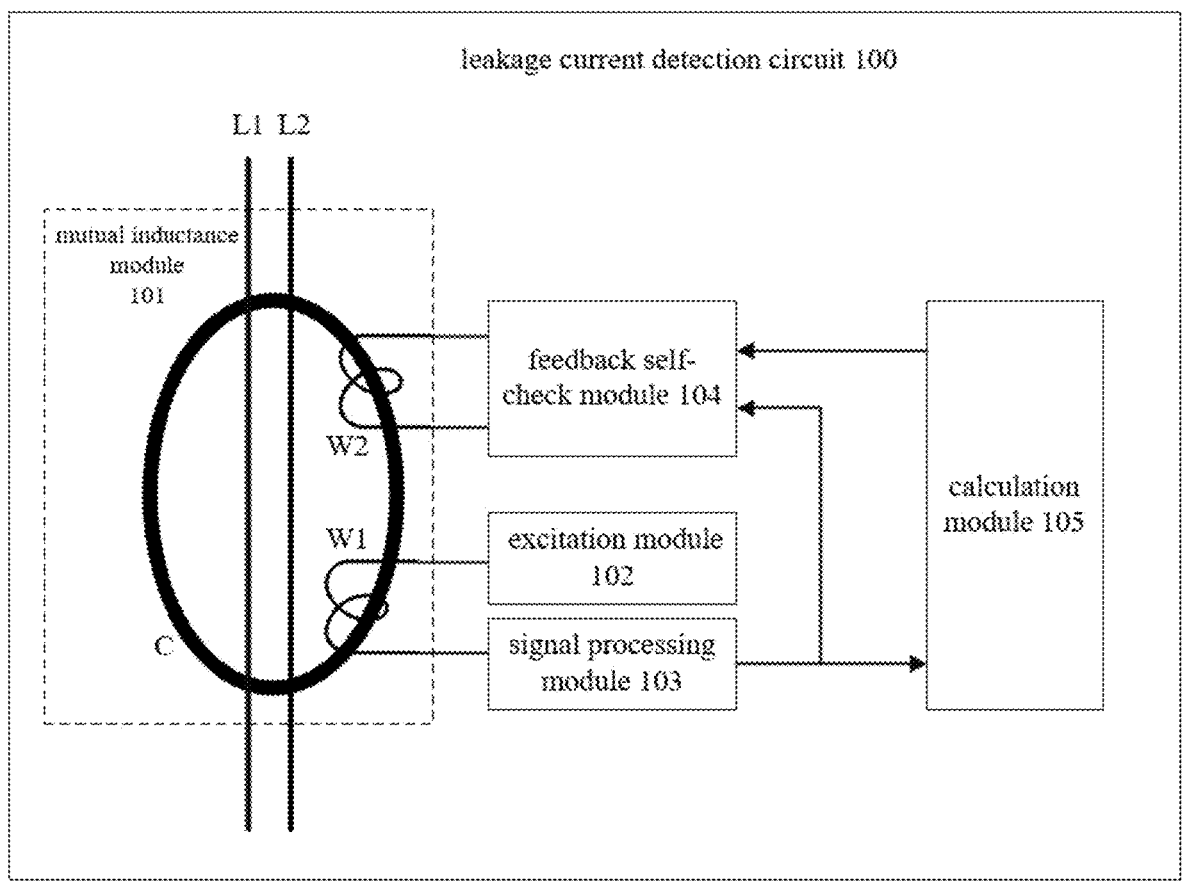
FIG. 1 illustrates a schematic diagram of a leakage current detection circuit according to an embodiment of the present disclosure.

In order to make the purpose, technical scheme and advantages of the present disclosure more obvious, example embodiments according to the present disclosure will be described in detail with reference to the figures. Obviously, the described embodiments are only a portion of the embodiments of the present disclosure, not all the embodiments of the present disclosure, and it should be understood that the present disclosure is not limited by the example embodiments described herein.

In the present specification and that figures, substantially same or similar steps and element are represented with the same or similar reference numerals, and repeat descriptions of these steps and elements will be omitted. Simultaneously, in the description of the present disclosure, the terms "first" and "second" are only configured for distinguishing descriptions, and cannot be understood as indicating or implying relative importance or ranking.

Unless otherwise defined, all the technical and scientific terms used herein have the same meanings as commonly understood by those skilled in the art of the present disclosure. The terms used herein is only for the purpose of describing the embodiments of the present disclosure, and are not intended to limit the present disclosure.

FIG. 1 illustrates a schematic diagram of a leakage current detection circuit according to an embodiment of the present disclosure.

As shown in FIG. 1, the leakage current detection circuit 100 can include, for example, a mutual inductance module 101, an excitation module 102, a signal processing module 103, a feedback self-check module 104 and a calculation module 105. The leakage current detection circuit according to an embodiment of the present disclosure is capable of operating in a leakage current detection mode and a self-check mode. In the leakage current detection mode, the leakage current detection circuit detects whether there is leakage current in the power lines, and in the self-check mode, the leakage current detection circuit self-checks whether the leakage current detection function is normal.

The mutual inductance module 101 can include, for example, a single magnetic core C, a first winding W1 and a second winding W2. The magnetic core C is passed through by power lines L1 and L2. The power lines L1 and L2 are only schematic, for example, in a single-phase power system, the power lines are fire line and zero line, and in a three-phase four-line power system, the power lines are three phase lines and neutral line.

The first winding W1 and the second winding W2 surround on the magnetic core C for producing and delivering a magnetic field.

The excitation module 102, for example, can be connected to the first winding W1 for producing an excitation current in the first winding W1. By loading the first winding W1 with an alternating excitation current with a fixed frequency and a fixed waveform, the magnetic core C is magnetized reciprocally to reach saturation.

Figure 2:
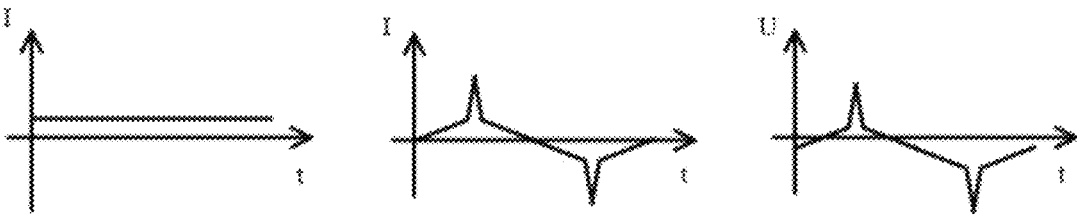
FIG. 2 exemplarily illustrates the formation of the output voltage signal waveform of the first winding according to an embodiment of the present disclosure.

The influence of the existence of the leakage current on the output voltage signal waveform of the first winding is schematically explained by FIG. 2. FIG. 2 exemplarily illustrates the formation of the output voltage signal waveform of the first winding according to an embodiment of the present disclosure.

The left side of FIG. 2 exemplarily illustrates the alternating excitation current waveform with a fixed frequency and a fixed waveform. It can be seen from the excitation current waveform that the magnetic core is saturated repeatedly under the application of excitation current.

The middle of FIG. 2 exemplarily illustrates the waveform of DC leakage current existing in the power lines L1 and L2, wherein the waveform of DC leakage current is a straight line.

The right side of FIG. 2 schematically illustrates the waveform of the output voltage signal of the first winding W1 under the condition that the first winding W1 is loaded with an excitation current and there is a DC leakage current in the power lines L1 and L2.

When there is no external current, that is, the leakage current in power lines L1 and L2, the waveform of the output voltage signal of the first winding W1 should be consistent with the waveform of the excitation current, that is, it only contains harmonics of the excitation waveform, and the waveform is positive and negative symmetric. When existing an external current containing a DC component, there are both a DC magnetic field and an excitation alternating magnetic field in the magnetic core C. The DC magnetic field produces an induced electromotive force and urges the excitation alternating magnetic field to saturate the magnetic core in advance in half an excitation period, while the magnetic core is delayed to saturate in the other half of the excitation period, therefore causing the waveform of the output voltage signal of the first winding W1 to be positive and negative half-cycle asymmetric in the excitation period, in such a way that the waveform shown on the right side of FIG. 2 is formed.

Subsequently, the output voltage signal of the first winding W1 is processed with the help of the signal processing module 103, so that the voltage signal corresponding to the excitation current is filtered out, and the waveform corresponding to the measured current can be obtained, therefore realizing leakage current detection.

The signal processing module 103 is, for example, connected with the first winding W1 and the calculation module 105 for processing the output voltage signal of the first winding W1 and outputting a processed signal, and the voltage signal corresponding to the excitation current produced by the excitation module 102 is filtered out of the processed signal.

According to an embodiment of the present disclosure, the output voltage signal is filtered before it is output to the calculation module 105, which reduces the calculation cost of the signal features (high frequency features, positive and negative half-cycle asymmetric time difference, positive and negative half-cycle asymmetric amplitude difference, etc.) extracted directly by the calculation module 105 from the output voltage signal, simplifies the circuit design and reduces the detection error.

The feedback self-check module 104 can be, for example, connected with the second winding W2 and includes a feedback circuit and a self-check circuit, which are not shown, wherein the feedback circuit is configured for closed-loop detection in the leakage current detection mode, thereby improving the stability and accuracy of the detection, and the self-check circuit is configured for simulating the existence of the leakage current in the self-check mode The feedback circuit is, for example, connected with the signal processing module 103 and receives the processed signal from the signal processing module 103 for producing a feedback current in the second winding W2 according to the processed signal. An exemplary feedback mechanism is that by producing a feedback current in the second winding W2, the second winding W2 produces a magnetic flux opposite to the magnetic flux produced by the measured current, that is, the leakage current, and the feedback circuit is designed in such a way that a zero-flux state is formed in the mutual inductance module 101, therefore achieving a feedback effect of reducing errors. Other known feedback mechanisms are also conceivable.

According to the embodiment of the present disclosure, higher accuracy and stability are realized through closed-loop detection, so that the leakage current detection and subsequent leakage current protection have higher reliability.

The self-check circuit is, for example, connected with the calculation module 105. In the self-check mode, the power lines L1 and L2 are disconnected. Then, the self-check signal is designed and output with the help of the calculation module 105, and the self-check signal can be designed according to the need, such as setting DC or AC signals, setting the amplitude and frequency of signals, etc. The self-check circuit produces a self-check current in the second winding W2 according to the self-check signal, and the self-check current produces a magnetic field in the magnetic core C, therefore simulating the situation that there is a leakage current in the power lines L1 and L2. Under the condition that there is a self-check current simulating the leakage current, when other modules work normally as in the leakage current detection mode, it is judged that the leakage current detection circuit passes the self-check. However, when the waveform of the processed signal, for example, deviates from the waveform of the self-check signal, it is judged that the leakage current detection circuit does not pass the self-check and the leakage current detection circuit needs to be further checked.

According to an embodiment of the present disclosure, by combining the self-check winding and the feedback winding, a separate self-check winding is not needed, and the cost is reduced and the volume is reduced.

The calculation module 105 is, for example, configured for analyzing the leakage current according to the processed signal. There are different leakage current detection standards for different leakage current types, and the calculation module 105 can judge whether there is a leakage current and calculate the specific value of leakage current in accordance with the respective leakage current detection standards. In the self-check mode, the calculation module 105 can also be configured for designing and outputting a self-check signal. After the self-check signal is output, the process of analyzing the leakage current by the calculation module 105 according to the processed signal is the same as that in the leakage current detection mode.

According to the embodiment of the present disclosure, different self-check signals can be customized according to needs and different types, sizes and frequencies of leakage currents can be simulated, and the self-check function of the leakage current detection circuit is advantageously improved.

Figure 3:
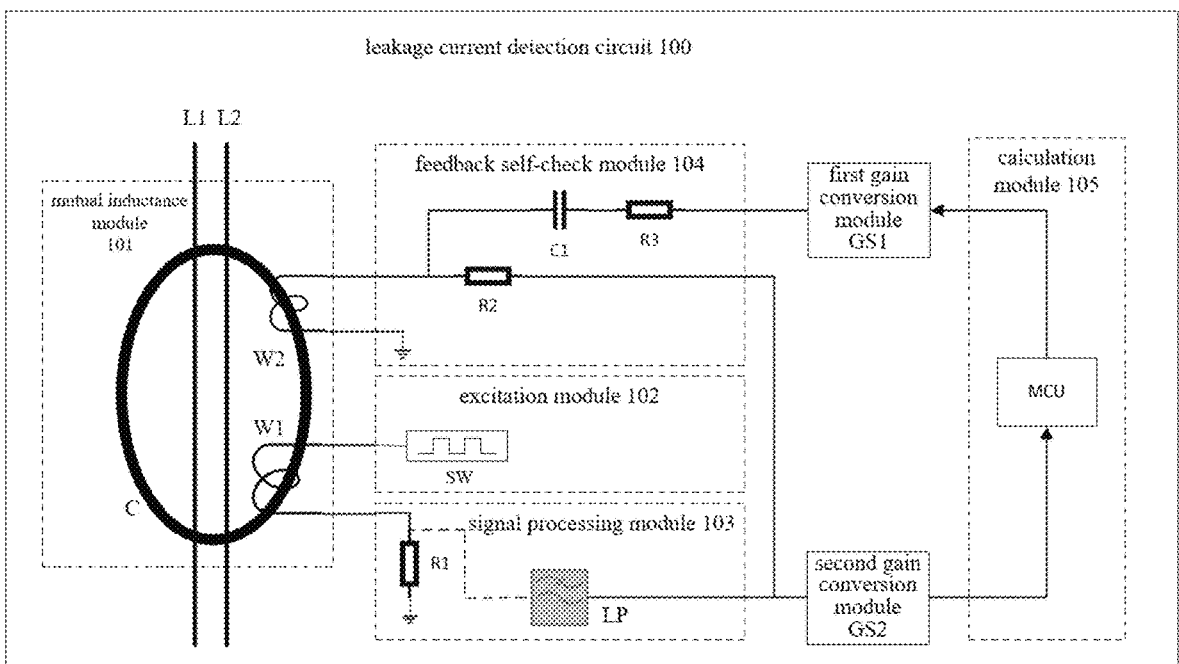
FIG. 3 illustrates a schematic diagram of an exemplary electrical mean of the leakage current detection circuit according to FIG. 1.

FIG. 3 illustrates a schematic diagram of exemplary electrical componentsof the leakage current detection circuit according to FIG. 1.

As shown in FIG. 3, the excitation module 102 can include, for example, a square wave excitation voltage generator, and the square wave excitation voltage generator is configured for producing positive and negative square wave voltages of a predetermined frequency applied at the first winding W1, thereby producing an excitation current with a predetermined frequency in the first winding W1. The excitation module 102 can be realized by, for example, a comparator, a self-excited oscillation circuit, etc.

Preferably, the predetermined frequency is a frequency greater than 5 times (for example, 8 times and 10 times) the frequency of the measured current. For example, when the frequency of the measured current is 1000 Hz, the predetermined frequency can be 8000 Hz. Advantageously, by setting a predetermined frequency significantly higher than the frequency of the measured current, the leakage current signal can be effectively distinguished from the excitation signal in the subsequent signal processing process, that is, a better filtering effect can be realized.

The signal processing module 103 can include, for example, a first resistor R1 and a low-pass filter LP.

One end of the first resistor R1 is connected with the first winding W1 and the other end is grounded, for making the output current of the first winding W1 flow back to the ground. By setting the number of windings of the first winding W1 and/or the size of the first resistor R1, the frequency and magnitude of the excitation current can be changed. Thus, the first resistor R1 can, for example, also be assigned to the excitation module 102, which is not limited by the present disclosure.

The low-pass filter LP is, for example, configured for receiving the output voltage signal from the first winding W1 and filtering out the voltage signal corresponding to the excitation current from the output voltage signal. Since the excitation current has the predetermined frequency which is obviously larger than the frequency of the measured current, the voltage signal corresponding to the excitation current can be filtered out by the low-pass filter LP. In this way, the waveform of the processed signal can reflect the waveform of the measured current.

The feedback circuit can include, for example, a second resistor R2. In this embodiment, one end of the second resistor R2 is connected with the signal processing module 103 to receive the processed signal, and the other end is connected with the second winding W2. The processed signal is, for example, a voltage signal, which is transformed into a feedback current signal through the second resistor R2 and applied at the second winding W2. For example, the size of the second resistor R2 can be determined according to the desired dynamic stability of the feedback mechanism and the amplitude of the output current, which is not limited by the present disclosure.

The self-check circuit can include, for example, a third resistor R3 and a capacitor C1 connected in series. In this embodiment, one end of the third resistor R3 is connected with the calculation module 105 to receive the self-check signal, and one end of the capacitor C1 is connected with one end of the second winding W2 to apply the self-check current at the second winding W2, and the other end of the second winding W2 is grounded.

Since the self-check signal is usually an AC signal in practical application, the capacitor C1 is exemplarily shown in this embodiment, and this capacitor C1 can be omitted without affecting the realization of the self-check function under the condition that the self-check signal is a DC signal.

The calculation module 105 can be, for example, a microcontroller (MCU). The microcontroller may include an integrated or external analog-to-digital converter and a digital-to-analog converter to receive the processed signal and output the self-check signal in the self-check mode.

As shown in FIG. 3, the leakage current detection circuit 100 according to the present disclosure can further include a first gain conversion module GS1 connected between the self-check circuit and the calculation module 105 and a second gain conversion module GS2 connected between the signal processing module 103 and the calculation module 105. The gain conversion module is configured for scaling the signal so as to meet the requirements of the calculation module 105 on the signal amplitude when receiving and outputting the signal. For example, the amplitude of the processed signal may be very small and needs to be amplified before it can be received and processed by the calculation module 105.

Figure 4A:
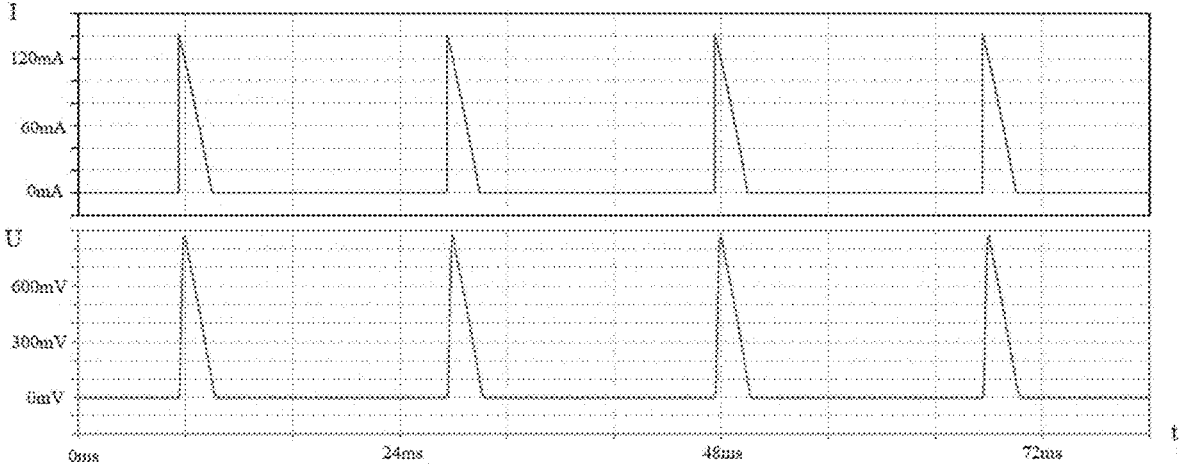
FIGS. 4a and 4b exemplarily illustrate waveforms of leakage current and processed signal according to an embodiment of the present disclosure.
Figure 4B:
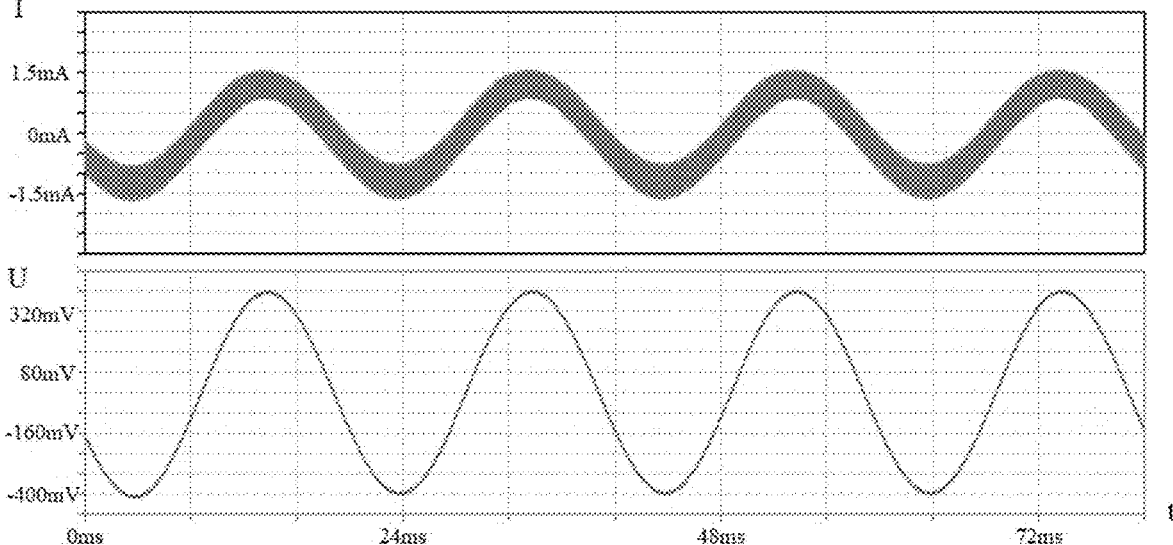

FIGS. 4*a* and 4*b* exemplarily show waveforms of leakage current and processed signal according to an embodiment of the present disclosure.

For example, the leakage current detection circuit according to the present disclosure is verified by simulation, and the waveform of the measured current is compared with the waveform of the processed signal, wherein the waveform information includes frequency and amplitude.

Different from the DC leakage current shown in FIG. 2, the waveform of 30 mA 135° pulsating DC leakage current is shown in the upper part of FIG. 4*a*, the waveforms of 50 mA and 50 Hz AC leakage current is shown in the upper part of FIG. 4*b*, and the waveforms of corresponding processed signals are shown in the lower parts of FIG. 4*a* and FIG. 4*b*, respectively.

As shown in FIG. 4*a*, the frequency of the waveform of the processed signal is basically consistent with the frequency of the waveform of the pulsating DC leakage current, and the amplitude of the waveform of the processed signal starts from 0. However, in the leakage current detection circuit where the DC component cannot be detected, the amplitude of the waveform should start from a negative value.

As shown in FIG. 4*b*, the frequency of the waveform of the processed signal is basically consistent with the frequency of the waveform of the AC leakage current.

The amplitude of the waveform of the processed signal is, for example, associated with the first winding W1 and the first resistor R1.

Through the simulation results, it can be known that the leakage current detection circuit according to an embodiment of the present disclosure can realize high-accuracy DC and AC leakage current detection.

Figure 5:
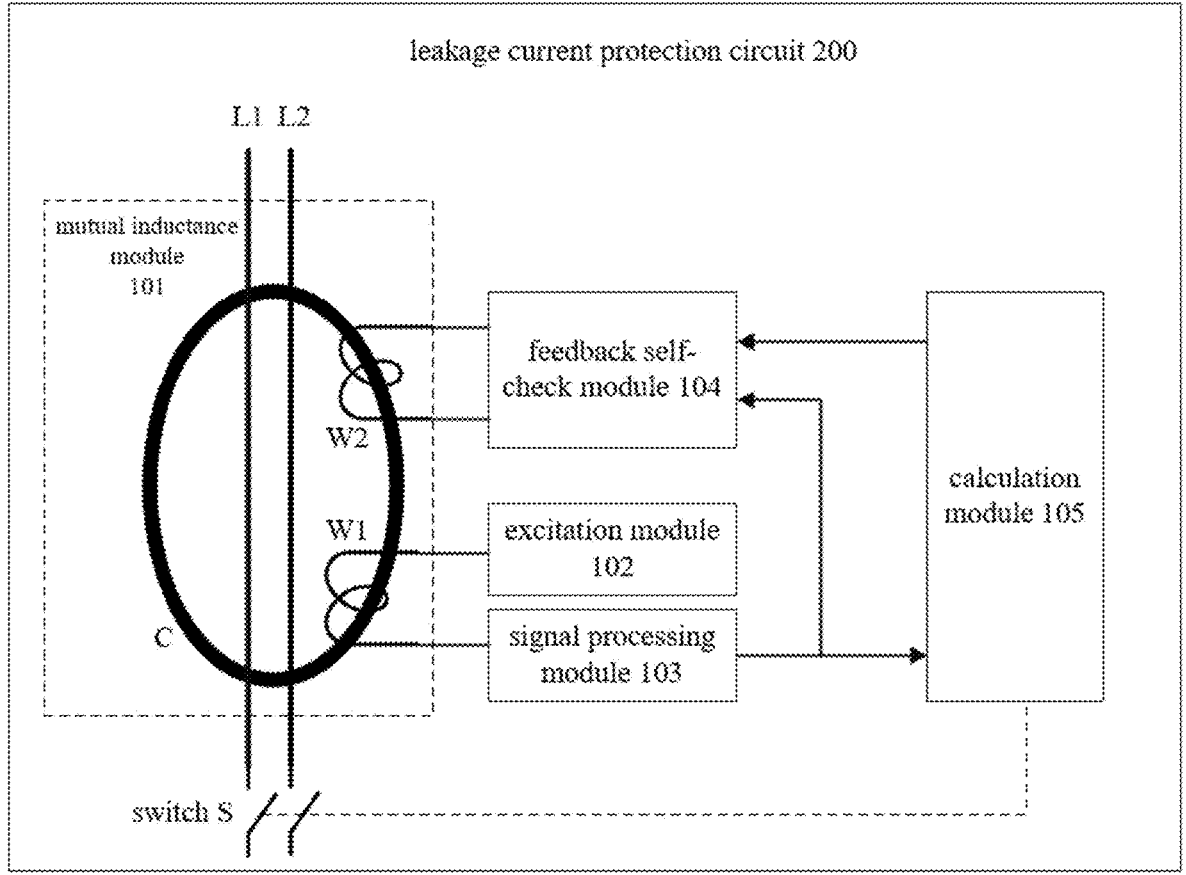
FIG. 5 illustrates a schematic diagram of a leakage current protection circuit according to an embodiment of the present disclosure.

FIG. 5 illustrates a schematic diagram of a leakage current protection circuit according to an embodiment of the present disclosure.

As shown in FIG. 5, the leakage current protection circuit 200 includes the leakage current detection circuit according to one of the embodiments of the present disclosure and a switch S, and the switch is connected with the leakage current detection circuit (especially the calculation module 105) and the power lines L1 and L2, and is configured for disconnecting the power lines L1 and L2 in response to the leakage current detected by the leakage current detection circuit, thereby protecting circuits and electrical devices.

The response mechanism of disconnection can include, for example, judging whether the amplitude of leakage current exceeds the threshold, whether the duration of leakage current exceeds the threshold, and so on.

According to an embodiment of the present disclosure, the leakage current detection circuit ensures high detection accuracy and stability while reducing the size by adopting a single magnetic core and double-winding closed-loop detection scheme; the separate self-check winding is omitted by combining the self-check winding with the feedback winding, which further reduces the size and reduces the cost, and the circuit design is simplified and the calculation cost is reduced by signal processing the output voltage signal; different types of self-check signals can be produced, and the self-check function is improved by the calculation module.

In generally, various example embodiments of the present disclosure can be implemented in hardware or dedicated circuits, software, firmware, logic, or any combination thereof. Some aspects can be implemented in hardware, while other aspects may be implemented in firmware or software that can be executed by a controller, microprocessor or other computing devices. When various aspects of embodiments of the present disclosure are illustrated or described as block diagrams, flowcharts or certain other graphical representations, it will be understood that the blocks, apparatus, systems, technologies or methods described herein can be implemented in hardware, software, firmware, dedicated circuits or logic, general-purpose hardware or controllers or other computing devices, or certain combinations thereof as non-limiting examples.

The example embodiments of the present disclosure described in detail above are only illustrative, not limited. Those skilled in the art should understand that various modifications and combinations can be made to these embodiments or their features without departing from the principle and spirit of the present disclosure, and such modifications should fall within the scope of the present disclosure.

What is claimed is:

1. A leakage current detection circuit capable of operating in a leakage current detection mode and a self-check mode, wherein the leakage current detection circuit comprises a mutual inductance module, an excitation module, a signal processing module, a feedback self-check module and a calculation module:

the mutual inductance module comprises a magnetic core, a first winding and a second winding, wherein the magnetic core is configured for being passed through by power lines, and the first winding and the second winding wrap around are surrounded on the magnetic core;

the excitation module is connected with the first winding and is configured for producing excitation current in the first winding;

the signal processing module is connected with the first winding and the calculation module, and is configured for processing the output voltage signal of the first winding and outputting a processed signal, and a voltage signal corresponding to the excitation current is filtered out of the processed signal by the signal processing module;

the feedback self-check module is connected with the second winding and comprises a feedback circuit and a self-check circuit, wherein the feedback circuit is connected with the signal processing module and is configured for producing a feedback current in the second winding according to the processed signal, and the self-check circuit is connected with the calculation module and is configured for producing a self-check current in the second winding according to a self-check signal; and the calculation module is configured for analyzing the leakage current according to the processed signal and outputting the self-check signal in the self-check mode.

2. The leakage current detection circuit according to claim 1, wherein the excitation module comprises a square wave excitation voltage generator for producing positive and negative square wave voltages of a predetermined frequency applied at the first winding.

3. The leakage current detection circuit according to claim 2, wherein the predetermined frequency is a frequency greater than 5 times a frequency of a measured current.

4. The leakage current detection circuit according to claim 1, wherein the signal processing module comprises a first resistor and a low-pass filter, wherein, one end of the first resistor is connected with the first winding and another end is grounded, for making an output current of the first winding flow back to ground; and the low-pass filter is configured for filtering out the voltage signal corresponding to the excitation current from the output voltage signal.

5. The leakage current detection circuit according to claim 1, wherein the feedback circuit produces the feedback current in the second winding according to the processed signal, so that the second winding produces a magnetic flux opposite to a magnetic flux produced by the measured current, and a zero-flux state is formed in the mutual inductance module.

6. The leakage current detection circuit according to claim 1, wherein the self-check circuit comprises a third resistor and a capacitor connected in series.

7. The leakage current detection circuit according to claim 1, wherein the calculation module is a microcontroller.

8. The leakage current detection circuit of claim 1, further comprising:

a switch connected with the leakage current detection circuit and power lines, the switch is configured for disconnecting the power lines in response to a leakage current detected by the leakage current detection circuit.

9. The leakage current detection circuit of claim 1, wherein the feedback circuit is configured for producing the feedback current in the second winding during the leakage current detection mode, and the self-check circuit is configured for producing the self-check current in the second winding during the self-check mode.

10. A leakage current detection circuit capable of operating in a leakage current detection mode and a self-check mode, wherein the leakage current detection circuit comprises a mutual inductance module, an excitation module, a signal processing module, a feedback self-check module and a calculation module:

the mutual inductance module comprises a magnetic core, a first winding and a second winding, wherein the magnetic core is configured for being passed through by power lines, and the first winding and the second winding wrap around the magnetic core;

the excitation module is connected with the first winding and is configured for producing excitation current in the first winding;

the signal processing module is connected with the first winding and the calculation module, and is configured for processing the output voltage signal of the first winding and outputting a processed signal, and a voltage signal corresponding to the excitation current is filtered out of the processed signal by the signal processing module;

the feedback self-check module is connected with the second winding and comprises a feedback circuit and a self-check circuit, wherein the feedback circuit is connected with the signal processing module and is configured for producing a feedback current in the second winding according to the processed signal, and the self-check circuit is connected with the calculation module and is configured for producing a self-check current in the second winding according to a self-check signal, wherein the feedback circuit comprises a second resistor, one end of the second resistor is connected with the signal processing module and another end is connected with the second winding; and the calculation module is configured for analyzing the leakage current according to the processed signal and outputting the self-check signal in the self-check mode.

11. A leakage current detection circuit capable of operating in a leakage current detection mode and a self-check mode, wherein the leakage current detection circuit comprises a mutual inductance module, an excitation module, a signal processing module, a feedback self-check module and a calculation module:

the mutual inductance module comprises a magnetic core, a first winding and a second winding, wherein the magnetic core is configured for being passed through by power lines, and the first winding and the second winding wrap around the magnetic core;

the excitation module is connected with the first winding and is configured for producing excitation current in the first winding;

the signal processing module is connected with the first winding and the calculation module, and is configured for processing the output voltage signal of the first winding and outputting a processed signal, and a voltage signal corresponding to the excitation current is filtered out of the processed signal by the signal processing module;

the feedback self-check module is connected with the second winding and comprises a feedback circuit and a self-check circuit, wherein the feedback circuit is connected with the signal processing module and is configured for producing a feedback current in the second winding according to the processed signal, and the self-check circuit is connected with the calculation module and is configured for producing a self-check current in the second winding according to a self-check signal;

the calculation module is configured for analyzing the leakage current according to the processed signal and outputting the self-check signal in the self-check mode; and a first gain conversion module connected between the signal processing module and the calculation module and a second gain conversion module connected between the self-check circuit and the calculation module, and the first gain conversion module is configured for scaling signals.

* * * * *